United States Patent
Tominaga et al.

(10) Patent No.: US 6,750,571 B2
(45) Date of Patent: Jun. 15, 2004

(54) MAGNETICALLY SHIELDED LINEAR MOTORS, AND STAGE APPARATUS COMPRISING SAME

(75) Inventors: Ryuichirou Tominaga, Kitakyushu (JP); Masafumi Tamai, Kitakyushu (JP); Keiichi Tanaka, Ageo (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 10/367,379

(22) Filed: Feb. 14, 2003

(65) Prior Publication Data

US 2003/0155820 A1 Aug. 21, 2003

(30) Foreign Application Priority Data

Feb. 18, 2002 (JP) ........................................ 2002-039621

(51) Int. Cl.[7] .............................................. H02K 41/00
(52) U.S. Cl. .................. 310/12; 250/492.2; 250/442.11; 355/72; 355/53
(58) Field of Search ............................. 250/442.11, 49, 250/1.2; 310/12, 13, 14; 255/53, 72–76

(56) References Cited

U.S. PATENT DOCUMENTS 6,043,572 A * 3/2000 Nagai et al. .................. 310/12
6,639,225 B2 * 10/2003 Kirschstein et al. ... 250/442.11

OTHER PUBLICATIONS

U.S. Patent Office Pre-Grant Publication 2003/01,111,614 A1 Jun. 19, 2003 Tanaka 250/442.11.*

U.S. patent application Ser. No. 10/318,999, Tanaka, filed Dec. 12, 2002.

* cited by examiner

Primary Examiner—Burton S. Mullins
Assistant Examiner—Judson H. Jones
(74) Attorney, Agent, or Firm—Klarquist Sparkman, LLP

(57) ABSTRACT

Stage apparatus are disclosed that provide high-accuracy positioning and movements of a stage platform, while generating reduced stray magnetic-field fluctuations and perturbations. The stage apparatus include at least one linear motor having a stator and a moving coil. Each stator includes a yoke that includes linear arrays of permanent magnets relative to which the moving coil, attached to the stage platform, moves inside a linearly extended coil gap in the yoke. A magnetic-shield plate extends around all outer surfaces and edges of the yoke as well adjacent the coil gap. The magnetic-shield plate is made of a magnetic material having high magnetic permeability.

14 Claims, 3 Drawing Sheets

MAGNETICALLY SHIELDED LINEAR MOTORS, AND STAGE APPARATUS COMPRISING SAME

FIELD

This disclosure pertains to stage apparatus as used, for example, in microlithography systems. Microlithography involves transfer-exposure of a pattern, usually defined on a reticle (also termed a "mask"), to a lithographic substrate such as a semiconductor wafer. Microlithography is a key technology used in the fabrication of microelectronic devices such as integrated circuits, displays, micromachines, and the like. More specifically, the disclosure pertains to stage apparatus that perform high-precision positioning with minimal generation of magnetic-field fluctuations.

BACKGROUND

Most contemporary microlithography is "optical" microlithography, which is performed using deep-ultraviolet light. To achieve greater pattern-transfer resolution, other microlithography technologies are under active development, including charged-particle-beam (CPB) microlithography (e.g., electron-beam microlithography) and "extreme ultraviolet" (EUV) microlithography. In view of the extremely high accuracy with which any of these microlithography techniques must be performed, it is imperative that the reticle (if a reticle is used) and the lithographic substrate be mounted on respective stage apparatus capable of providing high-accuracy movement and positioning of the reticle and substrate relative to each other and relative to the optical system of the microlithography tool. To such end, each such stage apparatus comprises one or more "actuators" that move a respective stage platform on which the reticle or substrate, respectively, is mounted.

For example, an electron-beam microlithography tool typically comprises a reticle stage and a substrate stage. The electron beam propagates in a vacuum through an electron-optical system that comprises electron lenses, deflectors, and the like, and that is situated relative to the reticle and substrate stage apparatus. In the electron-optical system, at least certain of the electron lenses and deflectors converge and deflect, respectively, the beam using magnetic fields. Hence, the beam is easily influenced by magnetic fields and is easily affected in an adverse manner by stray magnetic fields, especially stray magnetic fields associated with the stage apparatus (that are located near the beam trajectory in the tool). For this reason, the actuators usually selected for use in stage apparatus in electron-beam microlithography tools do not generate magnetic fields.

Exemplary actuators currently used in these stage apparatus include ultrasonic actuators and pneumatic actuators. Unfortunately, ultrasonic actuators generate contaminants and tend to outgas in a vacuum environment. Ultrasonic actuators also have poor reliability and tend to produce troublesome vibrations. Pneumatic actuators can exhibit a positioning accuracy that is less than desired, as caused by the characteristically non-linear response characteristics of these actuators, especially accompanying changes in actuator temperature.

Electromagnetic linear motors, in contrast, have high reliability, are easily controlled, produce low vibrations, and exhibit high positioning accuracy. Linear motors also tend not to exhibit non-linear deviations in operational behavior. Consequently, linear motors commonly are used as the actuators in stage apparatus in optical microlithography tools, especially since the UV light beam is unaffected by stray magnetic fields produced by linear motors. But, magnetic fields produced by linear motors have substantial effects on a charged particle beam. These effects, especially if of a variable nature, can be very difficult to control and/or reduce to insignificant levels. In view of this problem, linear motors conventionally are not favored for use as actuators in stages in CPB-microlithography tools. Nevertheless, in view of the many advantages of linear motors, efforts continue to be directed to the employment of linear motors in stage apparatus used in CPB microlithography tools. An approach to realization of this goal involves magnetically shielding the linear motors. Heretofore, satisfactory magnetic shielding has not been achieved.

The linear-motor concept has been extended to two dimensions for use in "planar" motors, which provide unfettered movement to a stage platform in two dimensions (e.g., X- and Y-dimensions), using a single motor. In this regard, reference is made to Japan Kôkai Patent Document No. 2001-217183. Planar motors generate substantial magnetic fields. In this reference the planar motor is partially shielded using a rectangular frame member having an L-shaped transverse section. The frame member is disposed in the vicinity of a magnetic pole of the planar motor, and shields some of the magnetic fields that tend to leak from the sides and top of the planar motor. Unfortunately, the realized shielding effect is insufficient.

Electromagnetic linear motors in which the stator comprises a magnetic yoke with permanent magnets and the moving member comprises a moving coil recently have been configured so that the magnetic yoke (which comprises part of the magnetic circuit in the motor) is not magnetically saturated. Such a configuration reduces leaking magnetic fields and provides better motor performance. However, practical use of these linear motors in stage apparatus of an electron-beam microlithography tool requires that additional magnetic-shielding measures be developed in view of the extremely strict magnetic-shielding requirements in such tools.

SUMMARY

In view of the shortcomings of the prior art as summarized above, the present invention provides, inter alia, stage apparatus that perform at the requisite high accuracy and precision of stage movement and positioning while satisfactorily suppressing stray magnetic fields that otherwise would significantly perturb, for example, the trajectory of a charged particle beam.

According to a first aspect of the invention, linear motors are provided that comprise a stator, a moving coil, and a magnetic shield. In an embodiment of such a linear motor, the stator includes a yoke that extends in a longitudinal direction and has a U-shaped transverse profile. The stator comprises two parallel linear arrays of permanent magnets mounted to respective inner walls of the yoke and facing each other across a coil-race gap that extends in the longitudinal direction. The yoke has outer surfaces as well as edge regions located adjacent the coil-race gap. The moving coil is situated inside the coil-race gap so as to move, when the moving coil is electrically energized, in the longitudinal direction relative to the arrays of permanent magnets. The magnetic shield extends around, with an intervening space, the outer surfaces of the yoke as well as the edge regions adjacent the coil-race gap, and extends in the longitudinal direction along the length of the yoke.

The magnetic shield desirably is formed as a unitary structure consisting of a single sheet of magnetic-shield material formed so as to conform, with the intervening space, to the outer surfaces of the yoke. The magnetic shield desirably is made of a material selected from the group consisting of Permalloy, soft iron, mild steel, Sendust, and ferrite.

The linear motor further can comprise a coil-mounting member having a T-shaped transverse profile including a stem of the T, wherein the moving coil is mounted on a distal end of the stem of the T. In this configuration, the magnetic shield includes respective lip portions that extend parallel to the stem of the T so as to shield at least a portion of the stem of the T along with the yoke.

The yoke and respective sets of permanent magnets can form individual magnetic loops in the stator that are constrained within the yoke. In this configuration, the magnetic shield effectively contains all stray magnetic fields produced by the stator and moving coil.

According to another aspect of the invention, stage apparatus are provided. An embodiment of such a stage apparatus comprises a guide member, a slider, a stage platform, and a first linear motor. The guide member extends in a longitudinal direction. The slider is guided by the guide member by a non-contacting air bearing situated between the slider and the guide member. The stage platform is mounted to the slider. The first linear motor actuates movement of the slider in the longitudinal direction relative to the guide member. The first linear motor is configured as summarized above.

The stage apparatus further can comprise a second linear motor that actuates, in cooperation with the first linear motor, movement of the slider in the longitudinal direction relative to the guide member, the second linear motor being configured and shielded similarly to the first linear motor. The first and second linear motors desirably apply, in a cooperative manner, a movement force to the slider at a center of gravity of the slider, so as to actuate movement of the slider in the longitudinal direction relative to the guide member.

Another aspect of the invention is directed to methods for magnetically shielding a linear motor, in the manner summarized above.

The foregoing and additional features and advantages of the invention will be more readily apparent from the following detailed description, which proceeds with reference to the accompanying drawings.

BRIEF DESCRIPTION OF THE DRAWINGS

FIGS. 2(a)–2(B) are a plan view and orthogonal elevational view, respectively, of a stage apparatus according to the representative embodiment, wherein FIG. 1 is a section along the line A-A in FIG. 2(A).

DETAILED DESCRIPTION

Aspects of the invention are described below in the context of representative embodiments, which are not intended to be limiting in any way. Furthermore, whereas certain descriptions are made in the context of an electron-beam microlithography system, it will be understood that linear motors and stage apparatus according to the invention can be used in any of various other systems that are not limited to electron-beam microlithography systems, charged-particle-beam microlithography systems, or microlithography systems in general. Furthermore, any relative positional terms used below, such as "top," "bottom," "upper," "lower," "left-hand," "right-hand," and the like, are to facilitate clarity of the disclosure and are not intended to be limiting in any way, unless otherwise explicitly noted.

Figure 2A:
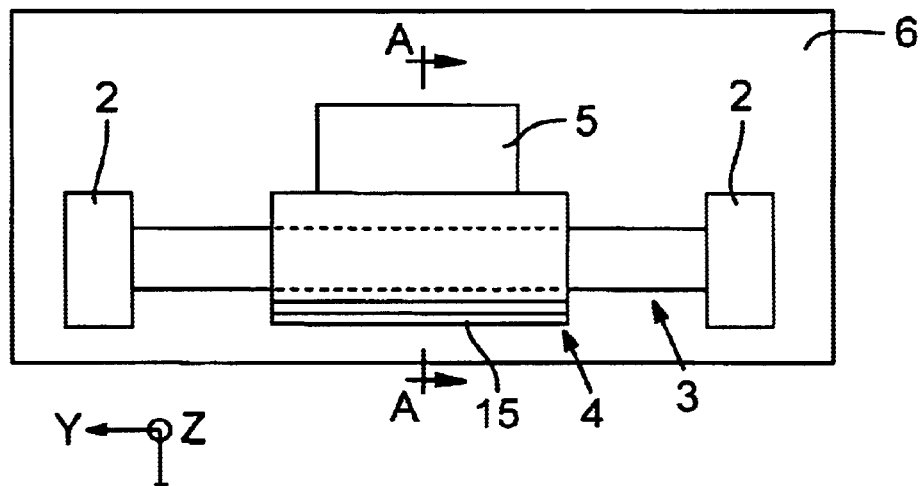
Figure 2B:
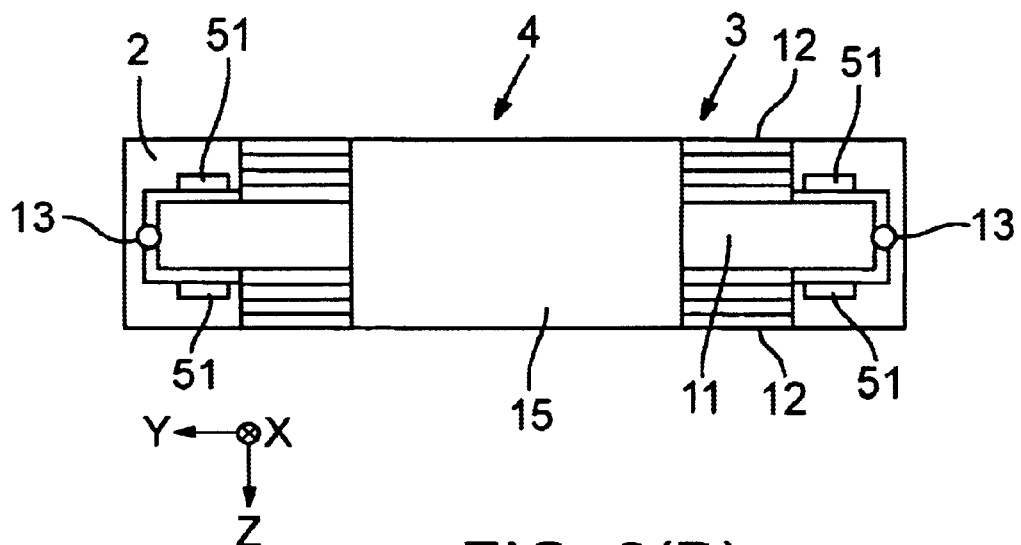

Reference first is made to FIGS. 2(A)–2(B), which depict key portions of a representative embodiment of a stage apparatus. In FIG. 2(A) a stationary guide 3, extending in the Y-direction, is attached to a stage base 6 by means of two guide supports 2. A slider 4 is fitted by means of an air bearing (not shown) onto the stationary guide 3 so that the slider 4 can slide in the Y-direction relative to the guide 3 without contacting the guide 3 (and thus with substantially zero friction). A table or platform 5, on which a reticle or lithographic substrate is mounted, is mounted to and extends from the slider 4.

Turning now to FIG. 2(B), the stationary guide 3 comprises a central guide bar 11 and yokes 12 that are disposed "above" and "below," respectively, the guide bar 11 in the figure. Each end of the guide bar 11 is inserted into a receptacle in the respective guide support 2. Between each end of the guide bar 11 and the respective guide support 2 are respective bearings 13, 51. The bearings 51 are air bearings that are situated in the upper and lower inner walls of the receptacle in each guide support 2. The air bearings 51 guide movement of the guide bar 11 in the X-direction without the guide bar 11 contacting the guide supports 2. The slider 4 moves relative to the guide bar 11 by air bearings that eliminate physical contact between the guide bar 11 and slider 4 (see FIG. 1), and thus render such movements substantially frictionless.

Figure 1:
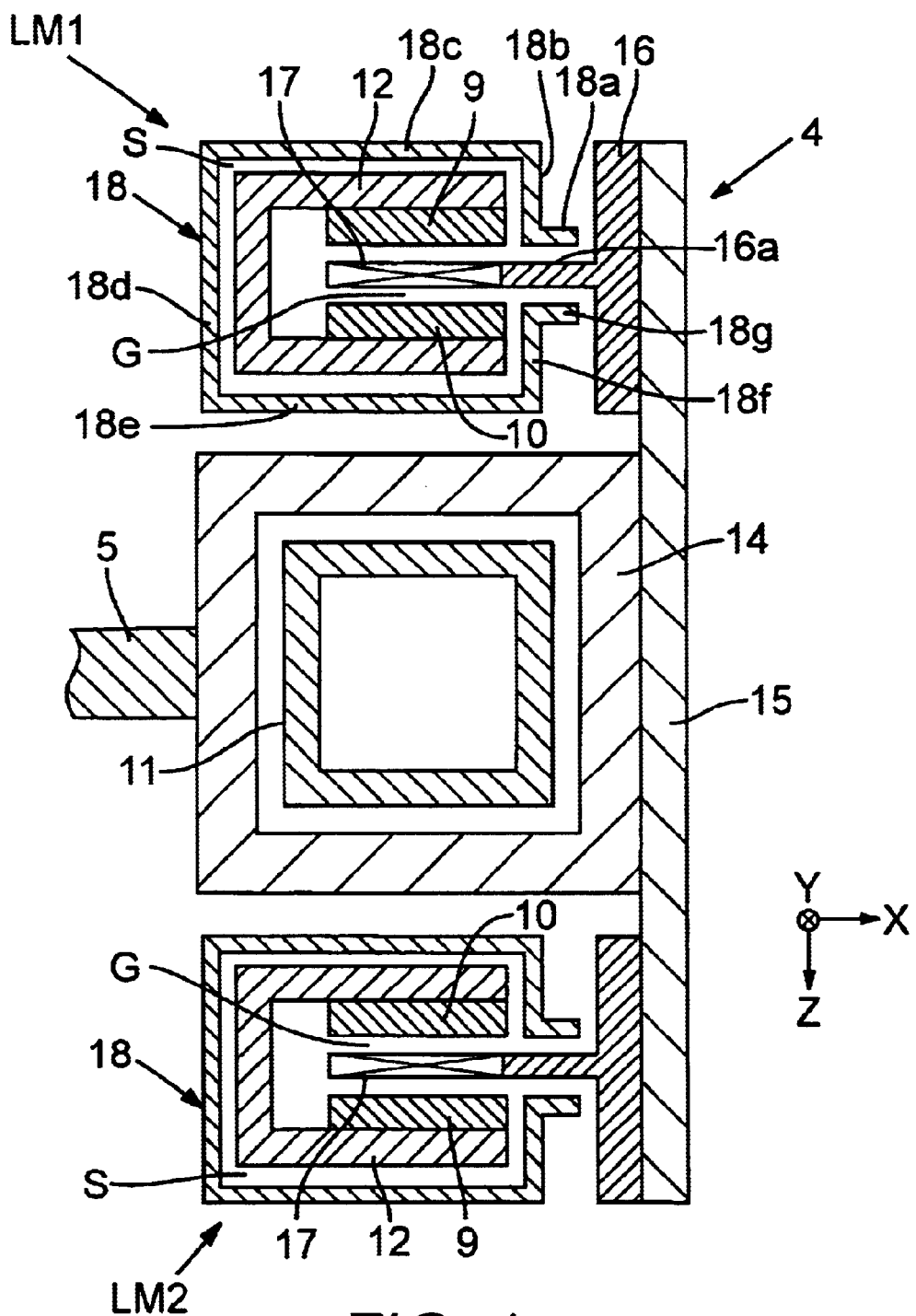
FIG. 1 is a transverse section through a stage apparatus, comprising two parallel linear motors, according to a representative embodiment.

Two yokes 12 are associated with the stationary guide 3, one located "above" the guide bar 11 and the other located "below" the guide bar 11 (FIG. 2(B)). As shown in FIG. 1, each yoke 12 is U-shaped, extends longitudinally in the Y-direction, and is disposed such that its respective open side faces away from the stage platform 5 (see FIG. 1). Each yoke 12 constitutes a respective part of a respective linear motor. In other words, the stage-apparatus embodiment shown in FIGS. 1 and 2(B) comprises two linear motors LM1, LM2 that work cooperatively to move the slider 4.

Figure 3:
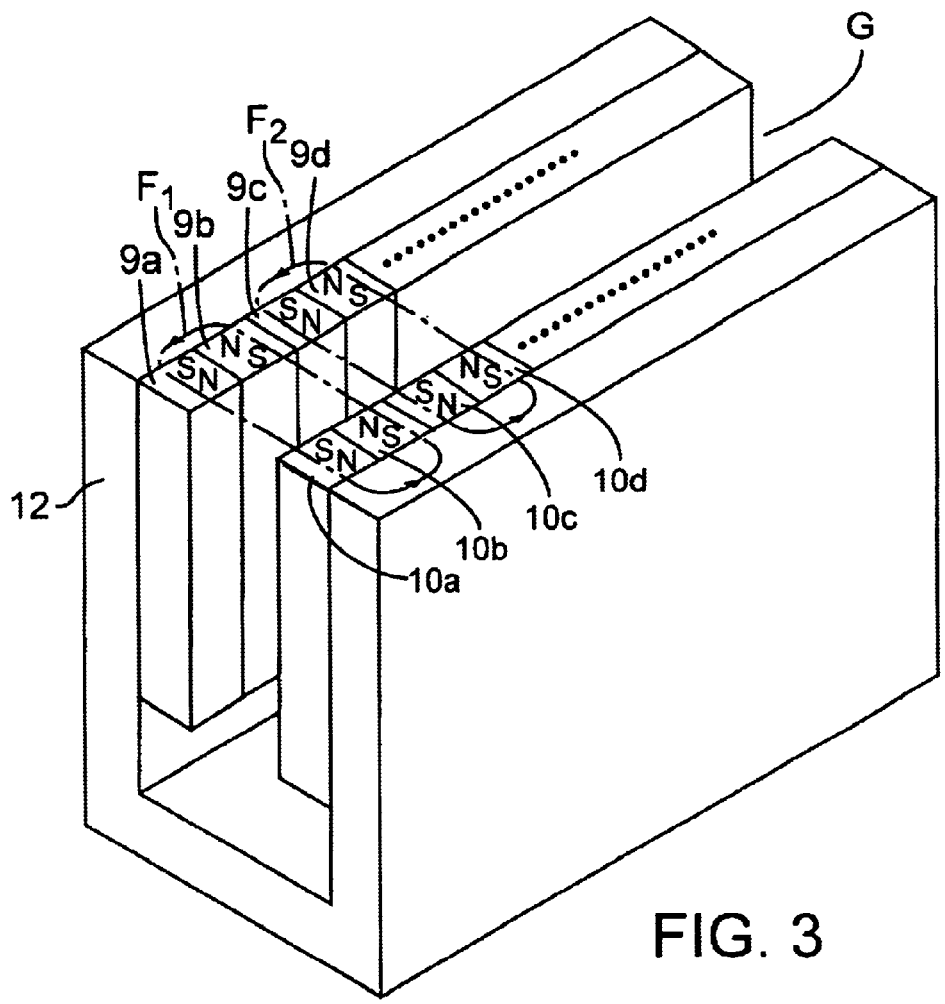
FIG. 3 is an isometric (oblique) view showing certain details of a yoke 12 of one of the linear motors shown in FIG. 1.

FIG. 3 is an oblique (isometric) view of certain details of a yoke 12 and its permanent magnets 9, 10 that collectively constitute the stator of the respective linear motor. The open side of the yoke 12 is oriented upward in the figure to reveal more clearly details of the magnets. The yoke 12 can be made of soft iron, mild steel, or other suitable material. The yoke 12 has a U-shaped transverse profile and extends in a longitudinal direction. The inner walls of the U-shaped yoke are lined with respective linear arrays of permanent magnets 9a, 9b, 9c, 9d, . . . , and 10a, 10b, 10c, 10d, . . . , that face each other across a gap G ("coil-race gap"). The permanent magnets 9, 10, in cooperation with the yoke 12, define a series of tightly constrained magnetic-flux loops. For example, the "N" pole of the magnet 9a and "S" pole of the magnet 10a face each other across the gap G, the "N" and "S" poles of the magnet 9a are disposed adjacent the "S" and "N" poles, respectively, of the magnet 9b on the same respective side of the gap G, the "N" and "S" poles of the magnet 10a are disposed adjacent the "S" and "N" poles, respectively, of the magnet 10b on the same respective side of the gap G, and the "N" pole of the magnet 10b and "S" pole of the magnet 9b face each other across the gap G. These four permanent magnets 9a, 9b, 10a, 10b form a respective closed magnetic-field loop $F_1$ that is tightly constrained largely to the yoke 12. In a similar manner, the four permanent magnets 9c, 9d, 10c, 10d form a respective closed magnetic-field loop $F_2$ that is tightly constrained largely to the yoke 12. This scheme is repeated for subsequent sets of four permanent magnets along the longitudinal dimension of the yoke 12.

A representative embodiment of a shielded linear motor is shown in FIG. 1, which depicts a section along the line A—A in FIG. 2(A). Also shown are the slider 4, the platform 5, the guide bar 11, and the yokes 12. In the figure the guide bar 11 and yokes 12 extend longitudinally in the Y-direction. The yokes 12 include respective permanent magnets 9, 10, as described above. Since the guide bar typically has a square transverse profile, a square-section tube 14 is disposed, at the center of the slider 4, in surrounding relationship to the guide bar 11. The right-hand side (in the figure) of the tube 14 is mounted to a planar slider plate 15 having a defined thickness. Between the inner walls of the tube 14 and corresponding facing surfaces of the guide bar 11 are respective static air bearings (not shown, but well understood in the art). Each such air bearing includes a respective differential-exhaust mechanism as understood in the art. Thus, the tube 14 slides in the Y-direction with substantially no friction relative to the guide bar 11.

Extending from the slider plate 15, "above" and "below" the tube 14 in the figure, are respective coil-mounting members 16 each having a T-shaped transverse section in the X-Z plane. Each coil-mounting member 16 has a protruding portion 16a (the stem of the "T") that extends leftward in the figure. A respective "moving" coil 17 is mounted to the distal end of each protruding portion 16a. The moving coils 17 are respective electrical coil windings that, when supplied with electrical current, are urged to move relative to the respective yokes 12. Each moving coil 17 fits into the open coil-race gap G of the respective yoke 12 between the arrays of permanent magnets 9, 10. Thus, two Y-drive linear motors LM1, LM2 are formed, one situated "above" and the other situated "below" the tube 14 in the figure.

By situating the linear motors LM1, LM2 relative to the slider 4 in the manner shown in FIG. 1, the driving forces applied by the linear motors to the slider 4 collectively are at the center of gravity of the slider 4 (i.e., at the center of the tube 14). By exerting the driving force at the center of gravity in this manner, high-precision and high-speed positional control of the slider is achieved. Although not shown in the figure, the slider 4 also defines or otherwise carries electrical wiring to and from the coils 17 and plumbing for circulating a coolant to the linear motors LM1, LM2.

As noted above, the magnetic fields produced by respective sets of permanent magnets 9, 10 are largely constrained to the yokes 12. However, these constraints are inadequate for reducing stray magnetic fields produced by the linear motors LM1, LM2 to satisfactorily low levels. Hence, each yoke 12 is nearly surrounded by a respective magnetic shield 18 having a defined thickness and separated from the yoke 12 by a defined space S (FIG. 1). More specifically, each magnetic shield 18 extends around the respective yoke 12 in the transverse (X-Z) section shown in FIG. 1, and extends similarly throughout the longitudinal dimension (Y-dimension) of the respective yoke 12. Thus, the magnetic shields 18 substantially cover the respective yokes 12, except for the respective coil-race gaps G, at which the respective shield 18 defines a longitudinally extended opening having a defined width. The magnetic shields 18 are made of a magnetic material having a high magnetic permeability, e.g., Permalloy, soft iron, mild steel, Sendust, ferrite, or the like.

A desired sectional profile of each magnetic shield 18 is as shown and described below with reference to the "upper" shield 18 in FIG. 1, by way of example. Each magnetic shield 18 desirably is formed by appropriately bending or otherwise forming a single respective sheet of shielding material, even though the following description refers to separate "plates" that constitute the magnetic shield 18. A side shield plate 18d extends in the Y-Z plane, and an "upper" shield plate 18c and a "lower" shield plate 18e extend in respective X-Y planes from the side shield plate 18d "above" and "below" the yoke 12. A first edge shield plate 18b extends "downward" in a Y-Z plane from the "upper" shield plate 18c, and a second edge shield plate 18f extends "upward" in the Y-Z plane from the "lower" shield plate 18e. An "upper" lip shield plate 18a extends to the "right" in a respective Y-X plane from the first edge shield plate 18b toward the slider plate 15. Similarly, a "lower" lip shield plate 18g extends to the "right" in a respective Y-X plane from the second edge shield plate 18f toward the slider plate 15. Thus, in the transverse section shown in FIG. 1, each magnetic shield 18 essentially conforms (with an intervening space S) to the transverse profile of the respective yoke 12. Note that the lip shield plates 18a, 18g extend along the protrusion 16a of the coil-mounting member 16. Each magnetic shield 18 is longitudinally extended the full length (in the Y-dimension) of the respective yoke 12.

By disposing the magnetic-shield plates 18 outside the yokes 12 (but adjacent respective outer surfaces of the yoke 12 and protrusion 16a) in the manner shown and described above, stray magnetic fields leaking from the yokes 12 are effectively contained by the shields 18. The shields also provide as much shielding as possible to magnetic openings (e.g., coil-race gap G). In addition, the magnetic shields provide effective shielding action without having to alter the structure of the linear motor. The magnetic shields By providing magnetic shielding of linear motors in the manner shown and described above, high-accuracy and high-accuracy stage positioning is achieved due to the high linearity and controllability of linear motors, without generating stray magnetic fields. Consequently, the linear motors can be used as stage actuators in CPB microlithography systems.

Whereas the invention has been described in connection with several representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. A linear motor, comprising:
   a stator, including a yoke extending in a longitudinal direction and having a U-shaped transverse profile, the stator comprising two parallel linear arrays of permanent magnets mounted to respective inner walls of the yoke and facing each other across a coil-race gap that extends in the longitudinal direction, the yoke having outer surfaces as well as edge regions located adjacent the coil-race gap;
   a moving coil situated inside the coil-race gap so as to move, when the moving coil is electrically energized, in the longitudinal direction relative to the arrays of permanent magnets; and
   a magnetic shield extending around, with an intervening space, the outer surfaces of the yoke as well as the edge regions adjacent the coil-race gap, and extending in the longitudinal direction along the length of the yoke.

2. The linear motor of claim 1, wherein the magnetic shield is formed as a unitary structure consisting of a single sheet of magnetic-shield material formed so as to conform, with the intervening space, to the outer surfaces of the yoke.

3. The linear motor of claim 2, wherein the magnetic shield is made of a material selected from the group consisting of Permalloy, soft iron, mild steel, Sendust, and ferrite.

4. The linear motor of claim 1, wherein the magnetic shield is made of a material selected from the group consisting of Permalloy, soft iron, mild steel, Sendust, and ferrite.

5. The linear motor of claim 1, further comprising a coil-mounting member having a T-shaped transverse profile including a stem of the T, wherein the moving coil is mounted on a distal end of the stem of the T, and the magnetic shield includes respective lip portions that extend parallel to the stem of the T so as to shield at least a portion of the stem of the T along with the yoke.

6. The linear motor of claim 1, wherein the yoke and respective sets of permanent magnets form individual magnetic loops in the stator that are constrained within the yoke.

7. A stage apparatus, comprising:
  a guide member extending in a longitudinal direction;
  a slider that is guided by the guide member by a non-contacting air bearing situated between the slider and the guide member;
  a stage platform mounted to the slider; and
  a first linear motor that actuates movement of the slider in the longitudinal direction relative to the guide member, the first linear motor comprising (a) a stator, including a yoke extending in the longitudinal direction and having a U-shaped transverse profile, the stator comprising two parallel linear arrays of permanent magnets mounted to respective inner walls of the yoke and facing each other across a coil-race gap that extends in the longitudinal direction, the yoke and respective sets of permanent magnets forming individual magnetic loops in the stator, the yoke having outer surfaces as well as edge regions located adjacent the coil-race gap; (b) a moving coil situated inside the coil-race gap so as to move, when the moving coil is electrically energized, in the longitudinal direction relative to the arrays of permanent magnets; and (c) a magnetic shield extending around, with an intervening space, the outer surfaces of the yoke as well as the edge regions adjacent the coil-race gap, and extending in the longitudinal direction along the length of the yoke.

8. The stage apparatus of claim 7, further comprising a second linear motor that actuates, in cooperation with the first linear motor, movement of the slider in the longitudinal direction relative to the guide member, the second linear motor being configured and shielded similarly to the first linear motor.

9. The stage apparatus of claim 8, wherein the first and second linear motors cooperatively apply a movement force to the slider at a center of gravity of the slider, so as to actuate movement of the slider in the longitudinal direction relative to the guide member.

10. The stage apparatus of claim 7, wherein the magnetic shield is formed as a unitary structure consisting of a single sheet of magnetic-shield material formed so as to conform, with the intervening space, to the outer surfaces of the yoke.

11. The stage apparatus of claim 10, wherein the magnetic shield is made of a material selected from the group consisting of Permalloy, soft iron, mild steel, Sendust, and ferrite.

12. The stage apparatus of claim 7, wherein the first linear motor further comprises a coil-mounting member having a T-shaped transverse profile including a stem of the T, wherein the moving coil is mounted on a distal end of the stem of the T, and the magnetic shield includes respective lip portions that extend parallel to the stem of the T so as to shield at least a portion of the stem of the T along with the yoke.

13. With respect to a linear motor including (a) a stator, including a yoke extending in a longitudinal direction and having a U-shaped transverse profile, the stator comprising two parallel linear arrays of permanent magnets mounted to respective inner walls of the yoke and facing each other across a coil-race gap that extends in the longitudinal direction, the yoke having outer surfaces as well as edge regions located adjacent the coil-race gap; and (b) a moving coil situated inside the coil-race gap so as to move, when the moving coil is electrically energized, in the longitudinal direction relative to the arrays of permanent magnets, a method for magnetically shielding the linear motor, the method comprising forming a magnetic shield extending around, with an intervening space, the outer surfaces of the yoke as well as the edge regions adjacent the coil-race gap, and extending in the longitudinal direction along the length of the yoke.

14. The method of claim 13, wherein the linear motor further includes a coil-mounting member having a T-shaped transverse profile including a stem of the T, wherein the moving coil is mounted on a distal end of the stem of the T, the method further comprising the step of forming the magnetic shield with respective lip portions that extend parallel to the stem of the T so as to shield at least a portion of the stem of the T along with the yoke.

* * * * *

UNITED STATES PATENT AND TRADEMARK OFFICE
CERTIFICATE OF CORRECTION

PATENT NO. : 6,750,571 B2
DATED : June 15, 2004
INVENTOR(S) : Tominaga et al.

Page 1 of 1

It is certified that error appears in the above-identified patent and that said Letters Patent is hereby corrected as shown below:

<u>Column 6,</u>
Line 35, "motor. The magnetic shields" should be -- motor. --.

Signed and Sealed this

Fourth Day of April, 2006

JON W. DUDAS
*Director of the United States Patent and Trademark Office*